United States Patent
Shimada

(10) Patent No.: US 10,106,886 B2
(45) Date of Patent: Oct. 23, 2018

(54) COATING APPARATUS FOR RESIN CONTAINER, AND RESIN CONTAINER MANUFACTURING SYSTEM

(71) Applicant: NISSEI ASB MACHINE CO., LTD., Komoro-Shi, Nagano (JP)

(72) Inventor: Kiyonori Shimada, Komoro (JP)

(73) Assignee: NISSEI ASB MACHINE CO., LTD., Nagano (JP)

( * ) Notice: Subject to any disclaimer, the term of this patent is extended or adjusted under 35 U.S.C. 154(b) by 146 days.

(21) Appl. No.: 14/761,924

(22) PCT Filed: Jan. 15, 2014

(86) PCT No.: PCT/JP2014/050596
§ 371 (c)(1),
(2) Date: Jul. 17, 2015

(87) PCT Pub. No.: WO2014/112533
PCT Pub. Date: Jul. 24, 2014

(65) Prior Publication Data
US 2015/0354057 A1 Dec. 10, 2015

(30) Foreign Application Priority Data
Jan. 18, 2013 (JP) ................................. 2013-007369

(51) Int. Cl.
*C23C 16/50* (2006.01)
*C23C 16/04* (2006.01)
(Continued)

(52) U.S. Cl.
CPC ............ *C23C 16/045* (2013.01); *C23C 16/44* (2013.01); *C23C 16/4583* (2013.01);
(Continued)

(58) Field of Classification Search
CPC .............. C23C 16/045; C23C 16/4587; B65G 2201/0244
See application file for complete search history.

(56) References Cited

U.S. PATENT DOCUMENTS 6,136,715 A * 10/2000 Shendon ................. B24B 37/32
156/345.12
2003/0159654 A1 8/2003 Arnold et al.
(Continued)

FOREIGN PATENT DOCUMENTS

CA 2824074 A1 * 7/2012 ............... B05D 1/62
DE 102011009057 A1 7/2012
(Continued)

OTHER PUBLICATIONS

European Search Report dated Jul. 7, 2016 for Application No. 14740984.1.
(Continued)

*Primary Examiner* — Aiden Lee
(74) *Attorney, Agent, or Firm* — David L. Hoffman; Hoffman Patent Group

(57) ABSTRACT

An object of the invention is to provide a coating apparatus for a resin container capable of improving mass-production efficiency of coating-treated resin containers. A plurality of container holding members, which are installed on a rotating table and can hold a resin container, are sequentially moved to a container supply position in which the resin container is supplied, a coating treatment position in which coating treatment of forming a thin film on an inner surface of the resin container is performed in a state of being combined with a chamber lid part, and a container detachment position in which the resin container to which the thin film is formed by the coating treatment can be detached according to the
(Continued)

rotation of the rotating table, so that the treatments in the respective positions are performed in parallel.

10 Claims, 4 Drawing Sheets

(51) Int. Cl.
  *C23C 16/458* (2006.01)
  *C23C 16/44* (2006.01)
(52) U.S. Cl.
  CPC .......... *C23C 16/4587* (2013.01); *C23C 16/50* (2013.01); *B65G 2201/0244* (2013.01)

(56) References Cited

U.S. PATENT DOCUMENTS

2003/0232150 A1* 12/2003 Arnold .................. B08B 7/00
  427/569
2004/0099214 A1* 5/2004 Hama .................. C23C 16/045
  118/723 E
2005/0155553 A1 7/2005 Hama et al.
2006/0177575 A1 8/2006 Takemoto et al.
2010/0096393 A1 4/2010 Asahara et al.
2014/0010969 A1 1/2014 Bicker et al.
2014/0110253 A1* 4/2014 Tamagaki ............. C23C 16/509
  204/298.06

FOREIGN PATENT DOCUMENTS

| JP | 2003306773 A | 10/2003 |
| JP | 2005002469 A | 1/2005 |
| JP | 2005036260 A | 2/2005 |
| JP | 2005178890 A | 7/2005 |
| JP | 2008231468 A | 10/2008 |
| JP | 4804654 B2 | 11/2011 |
| WO | WO03100122 A2 | 4/2003 |

OTHER PUBLICATIONS

International Search Report dated Apr. 15, 2014 for Application No. PCT/JP2014/050596.

* cited by examiner

COATING APPARATUS FOR RESIN CONTAINER, AND RESIN CONTAINER MANUFACTURING SYSTEM

This application is a U.S. national stage application of International Patent Application No. PCT/JP2014/050596, having an international filing date of Jan. 15, 2014, which designated the United States and which claims priority from Japanese Patent Application No. 2013-007369, filed on Jan. 15, 2013, the entirety of both of which are incorporated herein by reference.

TECHNICAL FIELD

The present invention relates to a coating apparatus for a resin container for forming a thin film on an inner surface of the resin container, and a resin container manufacturing system including this coating apparatus for the resin container.

BACKGROUND ART

A resin such as polyethylene widely used in household goods etc. generally has a property of being penetrated by low-molecular gas such as oxygen or carbon dioxide, and further has a property of sorption of a low-molecular organic compound inside therein. Because of this, in a case of using the resin as a container, it is known to be subject to various restraints in a use target, a use form, etc., as compared with other containers made of glass, etc. For example, in the case of filling a resin container with a carbonated drink and using it, carbonic acid of the carbonated drink may penetrate the resin container to the outside and it may be difficult to maintain quality as the carbonated drink for a long period.

Hence, in order to solve trouble caused by penetration of the low-molecular gas into the resin container and the sorption of the low-molecular organic compound in the case of manufacturing a resin container, it is known to form a film of a DLC (Diamond Like Carbon) coating etc., on an inside surface, etc., of the resin container by using a plasma CVD film formation technique. Also, from the standpoint of improvement in mass-production efficiency of mass-manufacturing the coating-treated resin containers, there is disclosed a coating apparatus in which, while a thin film is formed on an inner surface of the resin container held by a portion of the container holding part, a coating-treated resin container can be replaced with a resin container with no film formation in another portion of the container holding part (for example, see Patent Document 1).

PRIOR ART DOCUMENT

Patent Document

Patent Document 1: JP-B-4804654

SUMMARY OF THE INVENTION

Problem that the Invention is to Solve

However, in the coating apparatus described in Patent Document 1, a position in which the resin container with no film formation is supplied and a position in which the coating-treated resin container is detached are common. As a result, a step of supplying the resin container and a step of detaching the resin container cannot be performed in parallel, and it is difficult to improve mass-production efficiency of the coating-treated resin containers.

An object of the invention is to provide a coating apparatus for a resin container and a resin container manufacturing system, which are capable of improving mass-production efficiency of coating-treated resin containers.

Means for Solving the Problem

In order to solve the above-described problem, the invention provides a coating apparatus for a resin container, including: a rotating table, a driving mechanism for rotating the rotating table, a container holding member which is installed on the rotating table and capable of holding the resin container, and an electrode member capable of performing coating treatment of forming a thin film on an inner surface of the resin container held by the container holding member in a state of being combined with the container holding member, characterized in that: a plurality of the container holding members are installed on the rotating table so as to be arranged in: a container supply position in which the resin container is supplied; a coating treatment position in which the coating treatment is performed in a state of being combined with the electrode member; and a container detachment position in which the resin container to which the thin film has been formed by the coating treatment can be detached, and each of the plurality of container holding members installed on the rotating table is sequentially moved to the container supply position, the coating treatment position and the container detachment position according to rotation of the rotating table.

Further, in the coating apparatus for the resin container of the invention, it is preferable that the container holding member is further installed on the rotating table so as to be arranged in a cleaning treatment position in which an inside of the resin container to which the thin film has been formed by the coating treatment is cleaned, and each of the plurality of container holding members installed on the rotating table is sequentially moved to the container supply position, the coating treatment position, the cleaning treatment position and the container detachment position according to the rotation of the rotating table.

Further, the invention provides a resin container manufacturing system characterized by including: a resin container manufacturing apparatus for manufacturing a resin container; a coating apparatus for a resin container, and a resin container conveying apparatus for detaching the resin container, which is in a state of being manufactured and held by the resin container manufacturing apparatus, from the resin container manufacturing apparatus and conveying the resin container to the container supply position of the coating apparatus for the resin container, and causing the container holding member arranged in the container supply position to hold the resin container.

Advantage of the Invention

According to the invention, while the resin container is supplied to the container holding member arranged in the container supply position, at least the coating treatment of the resin container and processing of detaching the coating-treated resin container can be performed in parallel. Consequently, mass-production efficiency of manufacturing the coating-treated resin containers can be improved.

MODE FOR CARRYING OUT THE INVENTION

One example of an embodiment of a coating apparatus for a resin container and a resin container manufacturing system according to the invention will be described hereinafter based on the accompanying drawings.

Figure 1:
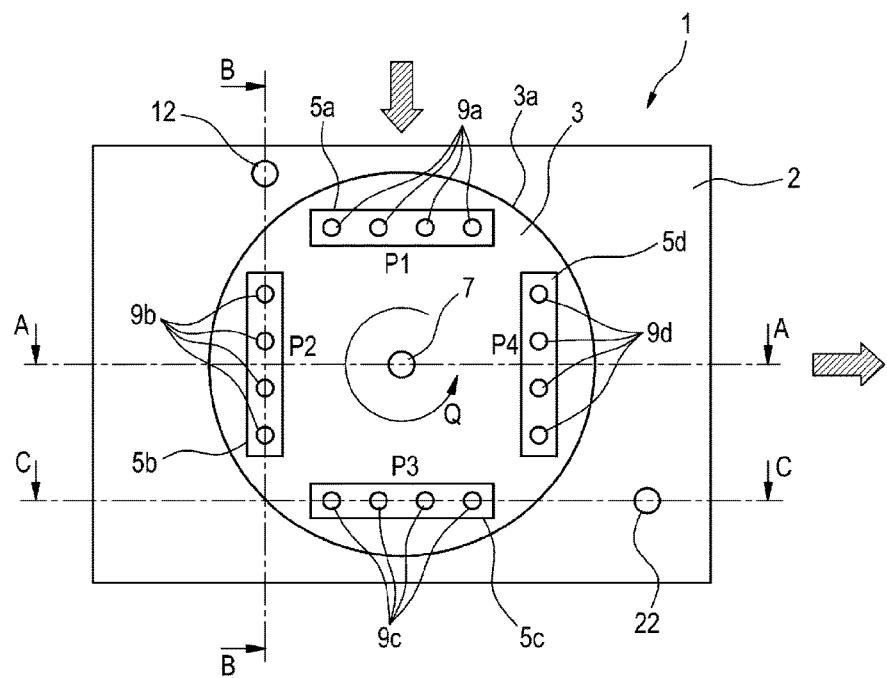
FIG. 1 is a plan view showing one example of a coating apparatus for a resin container according to the invention.
Figure 2:
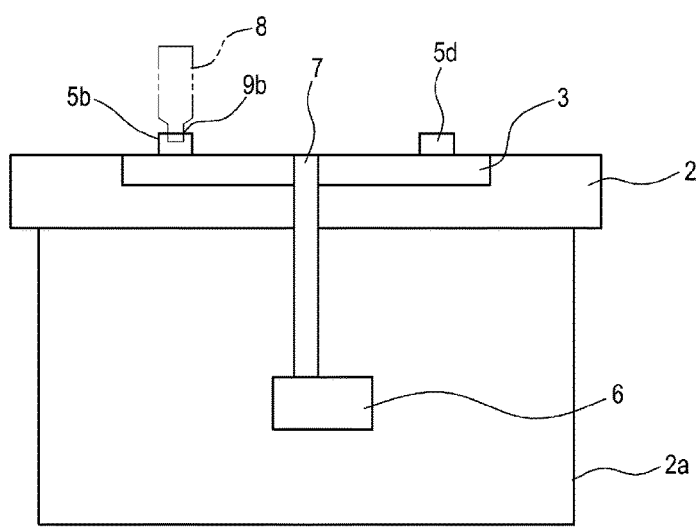
FIG. 2 is a sectional view taken on line A-A of FIG. 1.

FIG. 1 is a plan view in which a coating apparatus 1 for a resin container is viewed from above. FIG. 2 is a sectional view taken on line A-A of FIG. 1. As shown in FIGS. 1 and 2, the coating apparatus 1 for the resin container includes a machine table 2, a rotating table 3 arranged on an upper surface of the machine table 2, container holding members 5a, 5b, 5c, 5d for holding the resin containers, and a driving mechanism 6 for rotating and driving the rotating table 3.

The machine table 2 is formed of a thick plate with a rectangular shape. The center of the upper surface of the machine table 2 is formed with a circular recess 3a for attaching the rotating table 3. A lower portion of the machine table 2 is provided with a machine table base 2a for accommodating the driving mechanism 6.

The rotating table 3 is formed of a flat plate with a circular shape. A diameter of the rotating table 3 is formed slightly smaller than a diameter of the recess 3a of the machine table 2. The rotating table 3 is loosely inserted into the recess 3a of the machine table 2, and an upper surface of the rotating table 3 and the upper surface of the machine table 2 are arranged so as to have substantially the same height. The rotating table 3 is formed rotatably in a direction (counterclockwise direction) of an arrow Q shown in FIG. 1 around a support shaft 7 with respect to the machine table 2.

The plurality of (four in this embodiment) container holding members 5a, 5b, 5c, 5d are arranged on the upper surface of the rotating table 3. According to rotation of the rotating table 3 in the direction of the arrow Q, the container holding members 5a, 5b, 5c, 5d are rotated in the direction of the arrow Q together with the rotating table 3.

The driving mechanism 6 is a rotating mechanism for rotating the rotating table 3. The driving mechanism 6 can be constructed of, for example, a stepping motor, a servomotor, etc. The driving mechanism 6 rotates the rotating table 3 through the support shaft 7 fixed to the rotating table 3. The driving mechanism 6 is arranged inside the machine table base 2a.

Each of the container holding members 5a, 5b, 5c, 5d is a member capable of holding a plurality of resin containers. The container holding members 5a, 5b, 5c, 5d are installed on the rotating table 3 around the support shaft 7 at intervals of 90°.

The container holding member 5a (5b, 5c, 5d) has hole parts 9a (9b, 9c, 9d) for container holding that hold the placed resin containers. The plurality of (four in this embodiment) hole parts 9a (9b, 9c, 9d) for container holding are formed in the container holding member 5a (5b, 5c, 5d), and penetrate the container holding member 5a (5b, 5c, 5d) in a vertical direction. For example, as shown in the container holding member 5b of FIG. 2, a resin container 8 is held with a mouth part of the container 8 fitted into the hole part 9b for container holding.

The container holding members 5a, 5b, 5c, 5d are configured so as to be arranged in any of a container supply position P1, a coating treatment position P2, a cleaning treatment position P3 and a container detachment position P4 in a process of rotation in the direction of the arrow Q together with the rotating table 3. The positions in which the respective container holding members are arranged are set in an order of the container supply position P1 being first, the coating treatment position P2 being next, the cleaning treatment position P3 being next and the container detachment position P4 being last.

For example, in FIG. 1, the container holding member 5a is arranged in the container supply position P1, the container holding member 5b is arranged in the coating treatment position P2, the container holding member 5c is arranged in the cleaning treatment position P3, and the container holding member 5d is arranged in the container detachment position P4.

When the rotating table 3 is rotated in the direction of the arrow Q from this state, according to its rotation, each of the container holding members 5a, 5b, 5c, 5d is also rotated and is arranged in the next position. That is, the container holding member 5a is moved from the container supply position P1 and is arranged in the coating treatment position P2, the container holding member 5b is moved from the coating treatment position P2 and is arranged in the cleaning treatment position P3, the container holding member 5c is moved from the cleaning treatment position P3 and is arranged in the container detachment position P4, and the container holding member 5d is moved from the container detachment position P4 and is arranged in the container supply position P1.

The container supply position P1 is a position set as a stage in which a resin container with no coating treatment (container with no film formation) is supplied (position in which a step of supplying a container with no film formation is performed). For example, the plurality of containers with no film formation molded by a blow molding machine, etc., are fitted into the hole parts for container holding at equal intervals. In the present example, the four containers with no film formation are fitted into the hole parts 9a for container holding of the container holding member 5a arranged in the container supply position P1.

The coating treatment position P2 is a position set as a stage in which a plurality of resin containers are arranged inside a chamber and films are collectively formed on inner surfaces of the resin containers (position in which a coating treatment step is performed). The container holding member arranged in the coating treatment position P2 functions as a member for holding the resin containers placed on the hole parts for container holding and also functions as a chamber body part constructing the chamber. In a state shown in FIG. 1, the container holding member 5b is arranged in the coating treatment position P2, and the resin containers (four containers with no film formation supplied in the container supply position P1) placed on the container holding member 5b are sealed with the chamber and the films are collectively formed. Thus, for example, the container holding member 5b arranged in the coating treatment position P2 functions as a member for holding the resin containers 8 placed on the hole parts 9b for container holding and also functions as the chamber body part constructing the chamber.

The cleaning treatment position P3 is a position set as a stage in which particles such as specks, dirt, dust or foreign matter adhering to the inside of a resin container are removed (position in which a cleaning treatment step is performed). In the state shown in FIG. 1, the container holding member 5c is arranged in the cleaning treatment position P3, and the resin containers (four resin containers with the films formed in the coating treatment position P2) placed on the container holding member 5c are cleaning-treated.

The container detachment position P4 is a position set as a stage in which the resin container coating-treated and cleaning-treated is detached (position in which a step of detaching the container to which film formation is completed is performed). In the state shown in FIG. 1, the container holding member 5d is arranged in the container detachment position P4, and the resin containers placed on the hole parts 9d for container holding of the container holding member 5d (four resin containers cleaned in the cleaning treatment position P3) are detached as the containers to which the coating is completed.

Figure 3:
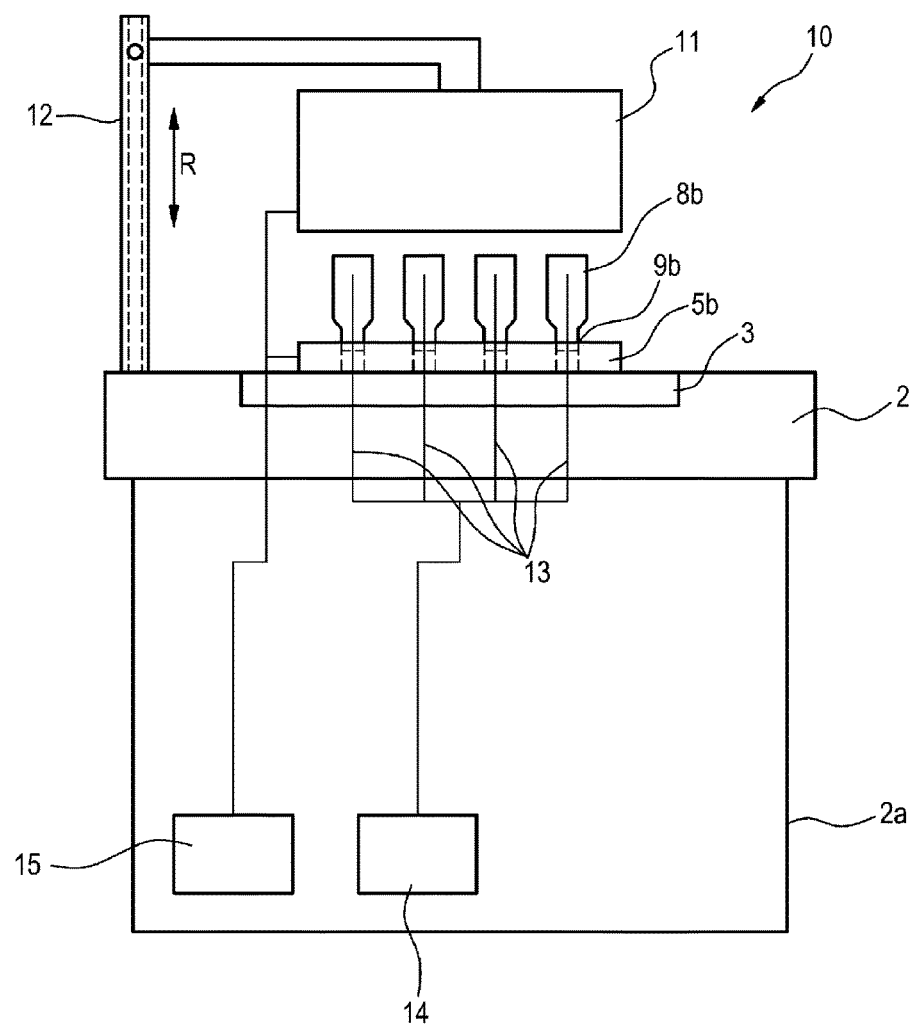
FIG. 3 is a sectional view taken on line B-B of FIG. 1.

FIG. 3 is a sectional view taken on line B-B of FIG. 1, and shows a coating part 10 formed in the coating treatment position P2. The coating part 10 stores a plurality of resin containers inside the chamber, and collectively forms films constructed of gas of a silicon compound, etc., on the inner surfaces of the resin containers by using a plasma CVD technique.

The coating part 10 includes the container holding member (container holding member 5b in the state shown in FIGS. 1 and 3) functioning as the chamber body part, a chamber lid part (one example of an electrode member) 11, a chamber lid support part 12, an internal electrode 13, a gas supply part 14, and a high-frequency power source 15.

In the coating treatment position P2, the container holding member 5b is combined with the chamber lid part 11 so as to configure the chamber for storing the resin container 8 together with the chamber lid part 11. Also, the container holding member 5b functions as the container holding member for holding the resin container 8.

The chamber lid part 11 is supported movably in a vertical direction (direction of R shown in FIG. 3) over the container holding member 5b by the chamber lid support part 12. The chamber lid part 11 is formed with a circular bottomed hole opened to the lower side and having an inside diameter slightly larger than an external shape of the resin container 8 in a position corresponding to the resin container 8 held by the container holding member 5b.

The internal electrode 13 is a pipe-shaped electrode respectively inserted and arranged inside the resin container 8 installed in a storage room of the chamber. The internal electrode 13 is joined to the gas supply part 14, and functions as the internal electrode and also functions as a gas nozzle for discharging gas.

The gas supply part 14 supplies raw material gas to the inside of each of the resin containers 8 through the internal electrode 13. As the raw material gas, gas mixed with gas such as oxygen or a silicon compound can be used.

The high-frequency power source 15 is a power source for supplying electric power to an external electrode of plasma CVD. The high-frequency power source 15 is arranged inside the machine table base 2a.

In the coating part 10 having such a configuration, the chamber lid part 11 is attached to the container holding member 5b in which a mouth part of the container 8 is fitted into the hole part 9b for container holding. The chamber lid part 11 is downwardly moved by the chamber lid support part 12 and is attached to the container holding member 5b. By attaching the chamber lid part 11, the inside of the container holding member 5b becomes sealed. Also, the internal electrode 13 is inserted and arranged inside the resin container 8 from the mouth part of the container 8.

Air in the chamber is discharged by a vacuum pump, and the inside of the storage room of the chamber is changed to a vacuum state. The raw material gas is supplied from the gas supply part 14, and the supplied raw material gas is discharged from the distal end of the internal electrode 13 having the pipe shape to the inside of the resin container 8. After the raw material gas is discharged, electric power is introduced from the external high-frequency power source 15 to the chamber. Accordingly, plasma is generated by a potential difference created between the internal electrode 13 and the chamber of the external electrode, and films are collectively formed on the inner surfaces of the four resin containers 8. Here, these treatments in the coating part 10 are performed based on each of the control signals outputted from a controller (not shown).

Figure 4:
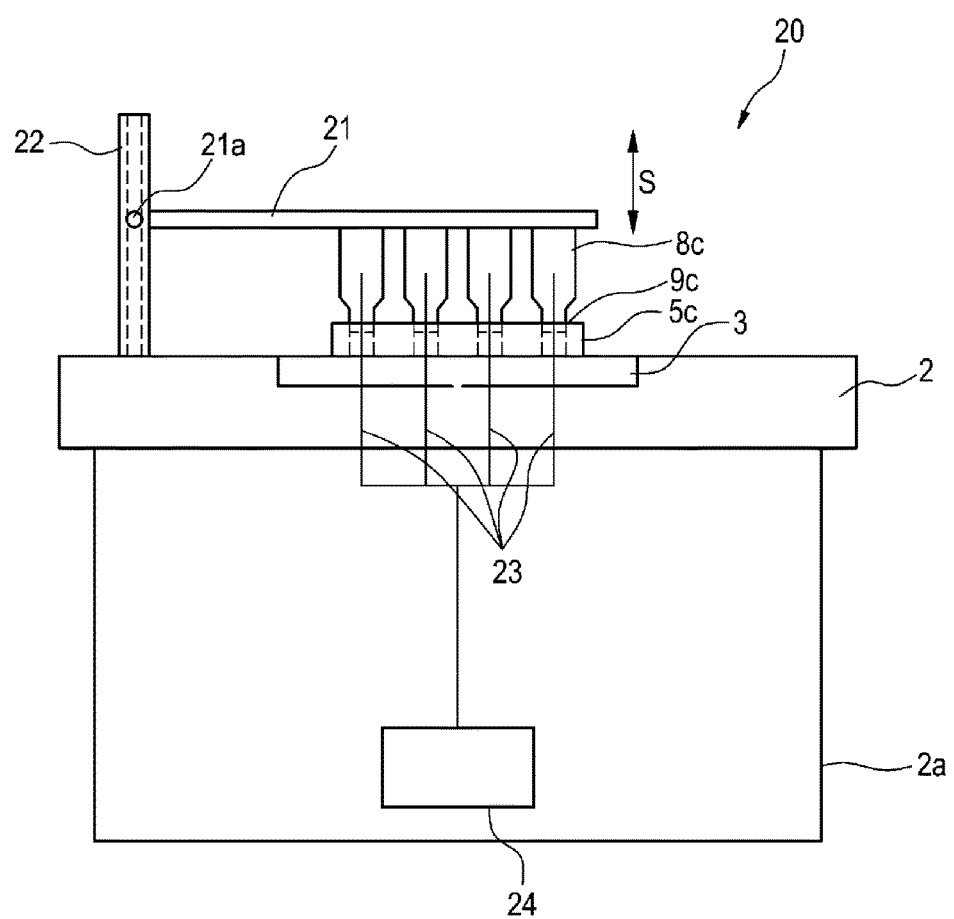
FIG. 4 is a sectional view taken on line C-C of FIG. 1.

FIG. 4 is a sectional view taken on line C-C of FIG. 1, and shows a cleaning part 20 formed in the cleaning treatment position P3. The cleaning part 20 includes the container holding member 5c, a container press part 21, a container press support part 22, a nozzle 23, and a gas supply part 24.

The container press part 21 is a member for preventing the resin container 8 from unfastening, which presses the resin container 8 fitted into the hole part 9c for container holding from above. One end 21a of the container press part 21 is attached to the container press support part 22, and the container press part 21 is supported movably in a vertical direction (direction of arrow S shown in FIG. 4).

The nozzle 23 is a pipe member respectively inserted into the resin container 8 held in the hole part 9c for container holding of the container holding member 5c. The nozzle 23 is joined to the compressed air supply part 24. Air supplied from the compressed air supply part 24 is discharged into the resin container 8 through the nozzle 23.

Incidentally, at the time of forming a film in the coating part 10 described above, the film may adhere to the internal electrode 13, etc., inserted into the resin container. In this case, by repeating a plurality coating treatments, the film becomes a large deposition substance gradually, and the deposition substance may peel off inside the resin container. Also, a deposition substance adhering to the inside of a discharged air passage may enter the inside of the resin container by being raised by the flow of air at the time of opening the air.

In such a cleaning part 20, the nozzle 23 is inserted into each of the resin containers 8, and compressed air is blown into the resin container 8 from the nozzle 23. At this time, the resin container 8 is pressed by arranging the container press part 21 in the upper side of the resin container 8 so as to prevent the resin container 8 set in the container holding member 5c from being blown off by the blowing of the compressed air. Accordingly, particles such as specks, dirt, dust or foreign matter adhering to the inner surface of the container at the time of forming the film can be removed to the outside of the resin container 8.

Next, operation of the coating apparatus 1 for the resin container configured in this manner will be described.

In an initial state in which coating treatment is performed, all of the four container holding members 5a, 5b, 5c, 5d are in an empty state, that is, a state in which resin containers are not placed. This state will be referred to as the initial state, and hereinafter, the operation will be described with reference to FIG. 1.

In the initial state, a resin container 8 with no coating and no film formation is first supplied by fitting the resin container 8 into the hole part 9a for container holding of the container holding member 5a arranged in the container supply position P1.

After the supply of the resin container 8 to the container holding member 5a is completed, the rotating table 3 is subsequently rotated 90° in the direction of the arrow Q around the support shaft 7. By this rotation, the container holding member 5a is moved to the coating treatment position P2.

At this time, the other container holding members 5b, 5c, 5d are also rotated by the same angle in the direction of the arrow Q, and the container holding member 5b is moved to the cleaning treatment position P3, the container holding member 5c is moved to the container detachment position P4, and the container holding member 5d is moved to the container supply position P1.

After the container holding member 5a is moved to the coating treatment position P2, the resin container 8 supplied to the container holding member 5a starts to be coating-treated in the coating treatment position P2. The contents of coating treatment are described above based on FIG. 3.

While the resin container 8 of the container holding member 5a is coating-treated in this coating treatment position P2, in parallel with this treatment, processing of fitting the resin container 8 with no film formation into the hole part 9d for container holding of the container holding member 5d arranged in the container supply position P1 is performed.

After the coating treatment of the resin container 8 supplied to the container holding member 5a and the processing of supplying the container to the container holding member 5d arranged in the container supply position P1 are completed, the rotating table 3 is further rotated 90°, and the container holding member 5a is moved to the cleaning treatment position P3.

At this time, the other container holding members 5b, 5c, 5d are also rotated by the same angle, respectively, and the container holding member 5b is moved to the container detachment position P4, the container holding member 5c is moved to the container supply position P1, and the container holding member 5d is moved to the coating treatment position P2.

After the container holding member 5a is moved to the cleaning treatment position P3, the resin container 8 held by the container holding member 5a starts to be cleaning-treated in the cleaning treatment position P3. The contents of cleaning treatment are described above based on FIG. 4.

While the resin container 8 of the container holding member 5a is cleaning-treated in this cleaning treatment position P3, in parallel with this treatment, the resin container 8 of the container holding member 5d arranged in the coating treatment position P2 is coating-treated. Also, processing of fitting the resin container 8 with no film formation into the hole part 9c for container holding of the container holding member 5c arranged in the container supply position P1 is performed.

After the cleaning treatment of the resin container 8 held by the container holding member 5a, the coating treatment of the resin container 8 held by the container holding member 5d and the processing of supplying the container to the container holding member 5c arranged in the container supply position P1 are completed, the rotating table 3 is further rotated 90°, and the container holding member 5a is moved to the container detachment position P4.

At this time, the other container holding members 5b, 5c, 5d are also rotated by the same angle, respectively, and the container holding member 5b is moved to the container supply position P1, the container holding member 5c is moved to the coating treatment position P2, and the container holding member 5d is moved to the cleaning treatment position P3.

After the container holding member 5a is moved to the container detachment position P4, processing of detaching the resin container 8 with the film formation placed on the container holding member 5a is started in the container detachment position P4. The resin container 8 detached from the coating apparatus 1 for the resin container is conveyed to a filling apparatus for filling the inside of the resin container with liquid.

While the processing of detaching the resin container 8 with the film formation held by the container holding member 5a is performed in this container detachment position P4, in parallel with this processing, the resin container 8 of the container holding member 5d arranged in the cleaning treatment position P3 is cleaning-treated. Also, the resin container 8 of the container holding member 5c arranged in the coating treatment position P2 is coating-treated. Also, container supply processing of fitting the resin container 8 with no film formation into the hole part 9b for container holding of the container holding member 5b arranged in the container supply position P1 is performed.

After each of the coating treatment, the cleaning treatment, the detachment processing and the container supply processing is completed, the rotating table 3 is further rotated 90°, and the container holding member 5a is again moved to the container supply position P1. At this time, the container holding member 5a is in the empty state in which the resin container is not supplied.

Then, for the container holding member 5a returning to the container supply position P1, the processing of supplying the resin container with no film formation is performed as described above. Also, when the rotation is further repeated, each of the operations described above is sequentially repeated in each of the positions P1 to P4.

In addition, each of the container supply processing, the coating treatment, the cleaning treatment, the detachment processing and the container supply processing described above is set so as to be completed within a predetermined time. In the present example, each of the four treatments and processing described above is set so as to be completed within ten seconds, and the rotating table 3 is rotated 90° in the direction of the arrow Q around the support shaft 7 every ten seconds, and each of the operations described above is repeated in each of the positions P1 to P4.

According to the coating apparatus 1 for the resin container of the embodiment as described above, the four container holding members 5a, 5b, 5c, 5d are installed on the rotating table 3, and according to the rotation of the rotating table 3, each of these container holding members 5a, 5b, 5c, 5d is sequentially moved to the container supply position P1 in which the container is supplied, the coating treatment position P2 in which the coating treatment is performed, the cleaning treatment position P3 in which the cleaning treatment is performed, and the container detachment position P4 in which the resin container is detached from the container holding member. As a result, for example, while the resin container 8 is supplied to the container holding member 5a arranged in the container supply position P1 shown in FIG. 1, the resin container 8 can be coating-treated by the chamber lid part 11 and the container holding member 5b arranged in the coating treatment position P2, and also, the resin container 8 of the container holding member 5c arranged in the cleaning treatment position P3 can be cleaning-treated and further, the coating-treated resin container can be detached from the container holding member 5d arranged in the container detachment position P4.

Accordingly, since the step of supplying the container with no film formation, the coating treatment step, the cleaning treatment step and the step of detaching the container to which film formation is completed can be performed in parallel, mass-production efficiency of manufacturing the resin containers requiring the coating treatment can be improved.

Figure 5:
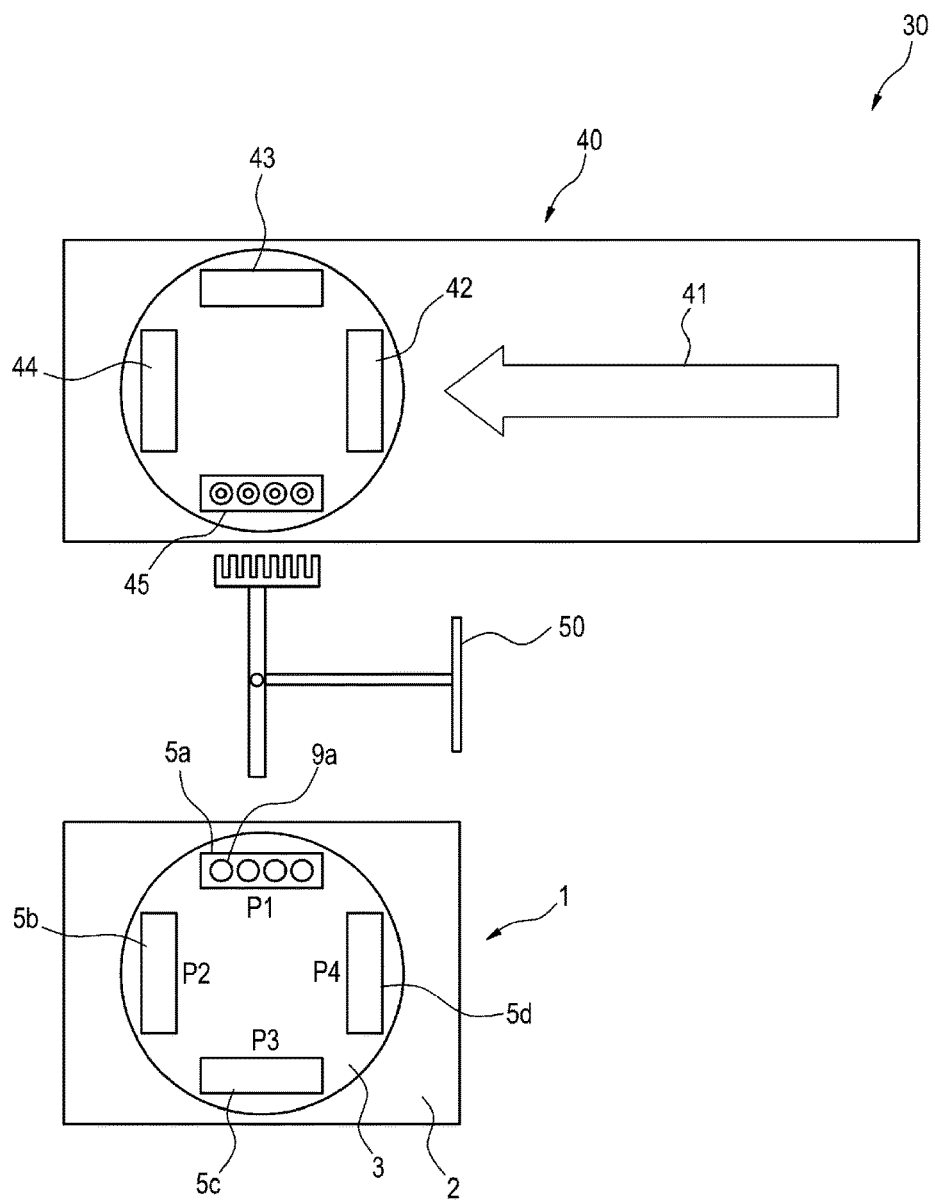
FIG. 5 is a plan view showing one example of a resin container manufacturing system according to the invention.

FIG. 5 is a plan view in which one embodiment of a resin container manufacturing system 30 is viewed from above. The resin container manufacturing system 30 includes a molding machine (one example of a resin container manufacturing apparatus) 40 for manufacturing a resin container, a coating apparatus 1 for a resin container for coating-treating the resin container, and a robot arm (one example of a resin container conveying apparatus) 50 for conveying the resin container manufactured by the molding machine 40 to the coating apparatus 1 for the resin container. Here, the coating apparatus 1 for the resin container is the same as the coating apparatus for the resin container described in the first embodiment.

The molding machine 40 includes a raw material supply stage 41 of supplying a raw material of a resin container, a preform molding stage 42 of molding a preform, a temperature adjusting stage 43 of making temperature distribution of the preform uniform, a blow molding stage 44 of blowing air, and a detachment stage 45 of detaching the molded resin container. The number of resin containers juxtaposed in the detachment stage 45 and a pitch of the resin container (pitch of a metal mold) are set so as to correspond to the number of hole parts 9a, 9b, 9c, 9d for container holding of the container holding members 5a, 5b, 5c, 5d arranged in the container supply position P1 of the coating apparatus 1 for the resin container and a pitch of the hole parts 9a, 9b, 9c, 9d for container holding.

The robot arm 50 is arranged between the molding machine 40 and the coating apparatus 1 for the resin container. The robot arm 50 detaches the resin container arranged in the detachment stage 45 of the molding machine 40, and conveys the detached resin container to the container holding member 5a arranged in the container supply position P1 of the coating apparatus 1 for the resin container. Also, the robot arm 50 causes the container holding member 5a to hold the conveyed resin container by fitting the resin container into the hole part 9a for container holding of the container holding member 5a.

According to the resin container manufacturing system 30 of the embodiment as described above, the resin container held in the molding machine 40 is directly supplied to the coating apparatus 1 for the resin container by the robot arm 50. As a result, mass-production efficiency is further improved since the need for alignment work of installation on the coating apparatus is eliminated as compared with a configuration in which the resin container manufactured by the molding machine 40 is conveyed by a belt conveyor and is conveyed to the coating apparatus.

Also, the number of resin containers of the detachment stage 45 and the pitch of the resin container (pitch of the metal mold) are set so as to correspond to the number of hole parts 9a, 9b, 9c, 9d for container holding in the container supply position P1 and the pitch of the hole parts for container holding, and thereby, the resin container can surely be delivered by the robot arm 50 and the mass-production efficiency can be improved more.

In addition, in a case of a configuration in which the number of resin containers of the detachment stage 45 and the pitch of the resin container (pitch of the metal mold) differ from the number of hole parts 9a, 9b, 9c, 9d for container holding in the container supply position P1 and the pitch of the hole parts for container holding, a configuration in which differences in the pitch and the number are adjusted by the robot arm 50 may be adopted.

Also, the number of container holding members arranged on the rotating table 3, that is, the number of different steps performed in parallel with the coating treatment step is not limited to the example described above, and three steps in which the cleaning treatment is omitted, or five or more steps in which different steps are added may be used. Accordingly, the mass-production efficiency can be further improved.

Also, the number of coating treatments is not limited to one, and two coating treatments may be performed. That is, two coating treatment steps may be included. In that case, the same coating treatment may be performed two times, or a film different from a film in a first coating treatment may be formed in a second coating treatment.

The invention has been described above in detail with reference to the specific embodiments, but it is apparent to those skilled in the art that various changes or modifications can be made without departing from the spirit and scope of the invention.

The invention has been described in detail with reference to the specific embodiments, but it is apparent to those skilled in the art that various changes or modifications can be made without departing from the spirit and scope of the invention.

The present application is based on Japanese patent application (patent application No. 2013-007369) filed on Jan. 18, 2013, and the contents of the patent application are hereby incorporated by reference.

DESCRIPTION OF REFERENCE NUMERALS AND SIGNS

1: COATING APPARATUS FOR RESIN CONTAINER
2: MACHINE TABLE
3: ROTATING TABLE
5a, 5b, 5c, 5d: CONTAINER HOLDING MEMBER (CHAMBER BODY PART)
6: DRIVING MECHANISM
7: SUPPORT SHAFT
8a, 8b, 8c, 8d: RESIN CONTAINER
9a, 9b, 9c, 9d: HOLE PART FOR CONTAINER HOLDING
10: COATING PART
11: CHAMBER LID PART (ONE EXAMPLE OF ELECTRODE MEMBER)
12: CHAMBER LID SUPPORT PART
13: INTERNAL ELECTRODE
14: GAS SUPPLY PART
15: HIGH-FREQUENCY POWER SOURCE
20: CLEANING PART
21: CONTAINER PRESS PART
22: CONTAINER PRESS SUPPORT PART
23: NOZZLE
24: COMPRESSED AIR SUPPLY PART
P1: CONTAINER SUPPLY POSITION
P2: COATING TREATMENT POSITION
P3: CLEANING TREATMENT POSITION
P4: CONTAINER DETACHMENT POSITION

The invention claimed is:
1. A coating apparatus for a resin container, comprising:
a rotating table,
a driving mechanism for rotating the rotating table, and
a plurality of container holding members which are installed on the rotating table and which are each capable of holding the resin container, wherein the plurality of the container holding members are installed on the rotating table so as to be arranged in: a container supply position in which each said resin container is supplied; a coating treatment position in which a coating treatment of forming a thin film on an inner surface of each said resin container held by the container holding members is performed; and a container detachment position in which each said resin container to which the thin film has been formed by the coating treatment can be detached, at the coating treatment position, there is provided an electrode member configured to perform the coating treatment of forming the thin film on the inner surface of the resin container held by the container holding member in a state in which the electrode member is combined with the container holding member, and wherein each of the plurality of container holding members installed on the rotating table is sequentially moved to the container supply position, the coating treatment position and the container detachment position according to rotation of the rotating table, wherein the coating apparatus further comprises a machine table, wherein the rotating table is configured to rotate relative to the machine table, and wherein the electrode member is attached to the machine table at the coating treatment position, wherein each of the plurality of container holding members includes a through-hole which penetrates the container holding member in a vertical direction, and a mouth of the resin container is inserted in the through-hole, wherein the coating apparatus further includes an inner electrode, and wherein, at the coating treatment position, the inner electrode is inserted inside the resin container by penetrating the through-hole which penetrates the container holding member in the vertical direction, a through-hole which penetrates the rotating table in the vertical direction, and a through-hole which penetrates the machine table in the vertical direction from a lower side, wherein the machine table has an upper surface and the rotating table is disposed in a recess in the upper surface of the machine table, the rotating table having an upper surface on which the container holding members are installed, the upper surface of the machine table and the upper surface of the rotating table lying substantially in one horizontal plane, and wherein, at the coating treatment position, the container holding member remains on the upper surface of the rotating table which remains substantially in the horizontal plane when in the state in which the electrode member is combined with the container holding member and the internal electrode is inserted upwardly through the mouth of each of multiple containers.

2. The coating apparatus for the resin container according to claim 1, wherein each of the container holding members is further installed on the rotating table so as to be arranged in a cleaning treatment position in which an inside of the resin container to which the thin film has been formed by the coating treatment is cleaned, and wherein each of the plurality of container holding members installed on the rotating table is sequentially moved to the container supply position, the coating treatment position, the cleaning treatment position and the container detachment position according to the rotation of the rotating table.

3. The coating apparatus for the resin container according to claim 2, wherein:

the container holding members are installed on the rotating table at intervals of 90°; and the driving mechanism is configured to rotate the table in intervals of 90° so that each of the plurality of container holding members installed on the rotating table is sequentially moved to the container supply position, the coating treatment position, the cleaning treatment position and the container detachment position.

4. The coating apparatus for the resin container according to claim 1, wherein:

each of the container holding members is configured to combine with the electrode member to form a chamber for storing the resin container held by the container holding member together with the electrode member.

5. The coating apparatus for the resin container according to claim 2, wherein:

each of the container holding members is configured to combine with the electrode member to form a chamber for storing the resin container held by the container holding member together with the electrode member.

6. A resin container manufacturing system comprising:

a resin container manufacturing apparatus for manufacturing a resin container, a coating apparatus for the resin container, and a resin container conveying apparatus for detaching the resin container, which is in a state of being manufactured and held by the resin container manufacturing apparatus, from the resin container manufacturing apparatus and conveying the resin container to the container supply position of the coating apparatus for the resin container, and causing the container holding member arranged in the container supply position to hold the resin container, wherein the resin coating apparatus comprises:

a rotating table, a driving mechanism for rotating the rotating table, and a plurality of container holding members which are installed on the rotating table and which are each capable of holding the resin container, wherein the plurality of the container holding members are installed on the rotating table so as to be arranged in: a container supply position in which the resin container is supplied; a coating treatment position in which a coating treatment of forming a thin film on an inner surface of the resin container held by the container holding member is performed; and a container detachment position in which the resin container to which the thin film has been formed by the coating treatment can be detached, at the coating treatment position, there is provided an electrode member configured to perform the coating treatment of forming the thin film on the inner surface of the resin container held by the container holding member in a state in which the electrode member is combined with the container holding member, and wherein each of the plurality of container holding members installed on the rotating table is sequentially moved to the container supply position, the coating treatment position and the container detachment position according to rotation of the rotating table, wherein the coating apparatus further comprises a machine table, wherein the rotating table is configured to rotate relative to the machine table, and wherein the electrode member is attached to the machine table at the coating treatment position, wherein each of the plurality of container holding members includes a through-hole which penetrates the container holding member in a vertical direction, and a mouth of the resin container is inserted in the through-hole, wherein the coating apparatus further includes an inner electrode, and wherein, at the coating treatment position, the inner electrode is inserted inside the resin container by penetrating the through-hole which penetrates the container holding member in the vertical direction, a through-hole which penetrates the rotating table in the vertical direction, and a through-hole which penetrates the machine table in the vertical direction from a lower side, wherein the machine table has an upper surface and the rotating table is disposed in a recess in the upper surface of the machine table, the rotating table having an upper surface on which the container holding members are installed, the upper surface of the machine table and the upper surface of the rotating table lying substantially in one horizontal plane, and wherein, at the coating treatment position, the container holding member remains on the upper surface of the rotating table which remains substantially in the horizontal plane when in the state in which the electrode member is combined with the container holding member and the internal electrode is inserted upwardly through the mouth of each of multiple containers.

7. The resin container manufacturing system according to claim 6, wherein each of the container holding members of the resin coating apparatus is further installed on the rotating table so as to be arranged in a cleaning treatment position in which an inside of the resin container to which the thin film has been formed by the coating treatment is cleaned, and wherein each of the plurality of container holding members installed on the rotating table is sequentially moved to the container supply position, the coating treatment position, the cleaning treatment position and the container detachment position according to the rotation of the rotating table.

8. The resin container manufacturing system according to claim 7, wherein each of the container holding members of the resin coating apparatus is installed on the rotating table at intervals of 90°; and the driving mechanism is configured to rotate the table in intervals of 90° so that each of the plurality of container holding members installed on the rotating table is sequentially moved to the container supply position, the coating treatment position, the cleaning treatment position and the container detachment position.

9. The coating apparatus for the resin container according to claim 1, wherein the electrode member is configured to be provided to the container holding member when the container holding member has arrived at the coating treatment position.

10. The resin container manufacturing system according to claim 6, wherein the resin container conveying apparatus detaches the resin containers from a detachment stage of the resin container manufacturing apparatus, and wherein a number and a pitch of the resin containers arranged on the detachment stage are set so as to correspond to a number and a pitch of the through-holes which penetrates the container holding member.

\* \* \* \* \*